United States Patent [19]
Toumazou

[11] Patent Number: 5,351,012
[45] Date of Patent: Sep. 27, 1994

[54] LOW INPUT RESISTANCE CURRENT-MODE FEEDBACK OPERATIONAL AMPLIFIER INPUT STAGE

[75] Inventor: Christofer Toumazou, Oxford, United Kingdom

[73] Assignee: Elantec, Inc., Milpitas, Calif.

[21] Appl. No.: 41,936

[22] Filed: Apr. 2, 1993

[51] Int. Cl.⁵ .............................................. H03F 3/30
[52] U.S. Cl. .................................... 330/264; 330/265; 330/267
[58] Field of Search ............... 330/264, 265, 267, 268, 330/269, 271, 273, 274

[56] References Cited

U.S. PATENT DOCUMENTS 5,103,188 4/1992 Benden ................................. 330/265
5,179,355 1/1993 Harvey ................................. 330/265

OTHER PUBLICATIONS

D. C. Wadsworth, "Accurate Current Conveyor Topology and Monolithic Implementation", IEE Proceedings, Apr. 1990, Part G, vol. 137, No. 2, pp. 88–94.
I. A. Koullias, "A Wideband Low-Offset Current-Feedback Op Amp Design"; Proceedings of the 1989 Bipolar Circuits and Technology Meeting, Minneapolis, Minn., Sep. 18–19, 1989, pp. 120–123.
A. Payne and C. Toumazou, "High Frequency Self-Compensation of Current-Feedback Devices", 1992 IEEE International Symposium Circuits and Systems, San Diego, Calif., May 10–13, 1992, pp. 1376–1379.

Primary Examiner—James B. Mullins
Attorney, Agent, or Firm—Leo V. Novakoski; Albert C. Smith

[57] ABSTRACT

A current feedback operational amplifier input stage is provided that uses a pair of dual output current mirrors to couple current from the inverting input of the amplifier to the high gain node of the amplifier, and to reduce the input impedance of the inverting input by means of local current feedback. Each of the dual output current mirrors employs an emitter degenerated Wilson-type current mirror in conjunction with an emitter degenerated transistor current source to detect signal current at the inverting input and use this current to control the bias current at both the inverting input and the high impedance node of the amplifier. The ratio of bias currents in the dual output current mirrors are controlled by scaling the resistances of the emitter degeneration resistors corresponding to each current node.

6 Claims, 6 Drawing Sheets

LOW INPUT RESISTANCE CURRENT-MODE FEEDBACK OPERATIONAL AMPLIFIER INPUT STAGE

FIELD OF THE INVENTION

The present invention relates to the field of current-mode feedback operational amplifiers and in particular to current-mode feedback operational amplifiers having low impedance, inverting inputs.

BACKGROUND OF THE INVENTION

The closed loop bandwidth for a conventional current feedback operational amplifier is given by:

$$B_W = [C_c(R_2 + G R_{in})]^{-1} \quad \text{(Eq. I)}$$

Here, $C_c$ is the compensation capacitance at the high gain node of the operational amplifier, $R_2$ is the feedback resistor, and G is the closed loop voltage gain for the amplifier, which is equal to $(1 + R_2/R_1)$, where $R_1$ is the gain-setting resistor between the inverting input of the operational amplifier and ground.

For an ideal current feedback operational amplifier, the input impedance, $R_{in}$, is zero, and consequently, the closed loop bandwidth of the circuit is independent of the amplifier gain. In conventional current feedback operational amplifiers, however, $R_{in}$ is non-zero, its magnitude being determined by the intrinsic emitter resistance of the transistors which form the inverting input of the amplifier. This emitter resistance depends on the bias current in the transistor, and for a bipolar transistor it is typically on the order 26 ohms per 1 mA of emitter current.

The feedback resistor, $R_2$, is typically on the order of a few thousand ohms, and as long as the product, $G R_{in}$, is small relative to $R_2$, the closed loop bandwidth of the amplifier will be virtually independent of gain. However, since $R_{in}$ is non-zero, $G R_{in}$ will be comparable $R_2$ for sufficiently high gains, causing a roll off in $B_W$.

The transfer function of a closed loop current-feedback operational amplifier and the DC closed-loop gain accuracy, $A_c$ also roll off for large gains. The transfer function is given by:

$$V_{out}/V_{IN} = G Z_t/(Z_t + R_2 + G R_{in}), \quad \text{(Eq. II)}$$

where $Z_t$ is the open loop transimpedance gain. As with $B_W$, the transfer function will begin to decrease as the product $G R_{in}$ becomes comparable to $R_2$ at high gains. Similarly, the DC closed-loop gain is given by:

$$A_c = G Z_o/(Z_o + R_2 + G R_{in}), \quad \text{(Eq. III)}$$

where $Z_o$ is the DC open loop transimpedance gain. As with $B_W$ and the transfer function, the gain accuracy falls off for large gains due to its inverse dependence on the factor $G R_{in}$.

In addition to these problems, the inverse dependence of $R_{in}$ on the transistor bias current introduces non-linearities into the circuit response for large input signals. While the effect of such non-linearities can be partially offset by operating the amplifier at higher bias currents, this approach increases power dissipation and noise in the amplifier circuit.

SUMMARY OF THE INVENTION

The present invention is an input stage for a current feedback operational amplifier which provides a low impedance inverting input, and consequently reduces the gain dependence of the bandwidth, transfer function, and DC closed-loop accuracy of the circuit. In addition, the bias current of the input stage is amplified at the output stage, providing higher slew rates without increasing the DC power dissipation or noise in the voltage buffer.

The present invention utilizes a new dual output current mirror to reduce the impedance at the inverting input of the voltage buffer by means of a current feedback loop. The dual current mirror combines a Wilson-type current mirror and a transistor current source. The input of the dual current-mirror is driven by the collector of the inverting input transistor. One of the outputs from the dual current-mirror is connected back to the inverting input to form a local current-feedback loop, reducing the input impedance by a factor related to the current gain of the current-mirror. The second output forms the high impedance z-node of the current mirror. Current gain in the new dual current-mirror is determined by the ratio of emitter degeneration resistors.

The current scaling provided by the dual output current mirror has the added advantage of generating a larger current at the high gain node of the amplifier with a smaller biasing current in the voltage buffer. Thus, the output node can operate with sufficient current to insure high slew rates at the amplifier output, while the voltage buffer can operate at lower bias currents, reducing the noise and power dissipation, and increasing the low input impedance associated with high bias currents.

DETAILED DESCRIPTION OF THE INVENTION

Figure 1:
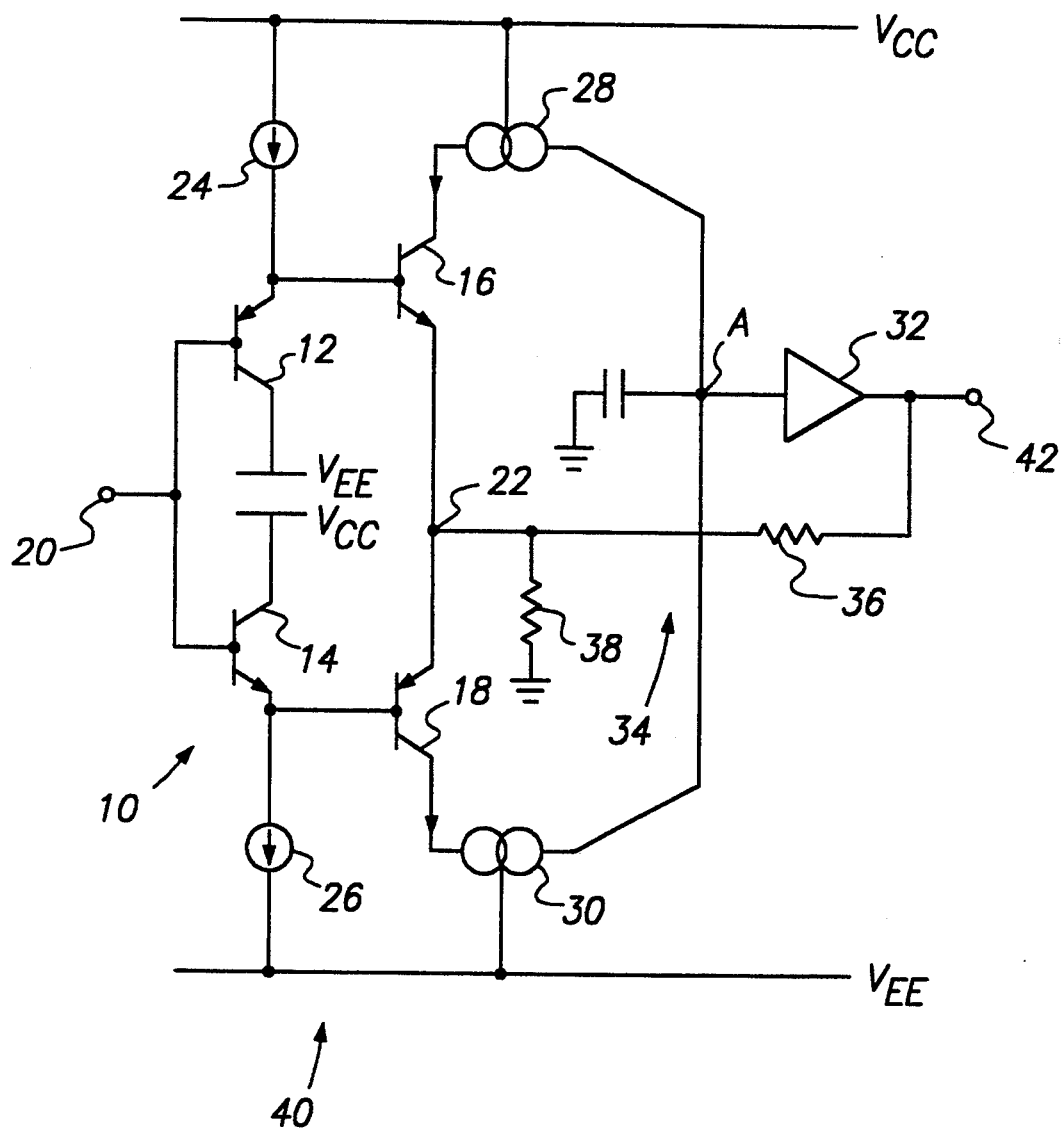
FIG. 1 is a schematic diagram of a conventional current feedback operational amplifier.

Referring to FIG. 1, there is shown a schematic diagram of a conventional current feedback operational amplifier. A voltage buffer 10 comprises a first pair transistors 12, 14 having complimentary conductivity properties and a second pair of transistors 16, 18 also having complimentary conductivity properties. The bases of transistors 12, 14 are connected together, forming a non-inverting input 20, and the emitters of transistors 16, 18 are connected together, forming an inverting input 22. Current sources 24, 26 provide bias current to transistors 12, 14, 16, 18. Current mirrors 28, 30 provide a replica of that current to point A, the high gain node of the current feedback operational amplifier 40. A feedback circuit 34 comprises a feedback resistor 36 and a gain setting resistor 38 connected as a voltage divider between output 42 of output buffer 32 and inverting input 22.

The open-loop input impedance at inverting input 22 is determined by the parallel resistance of the transistors 16, 18 which is just the intrinsic emitter resistance, $R_e$, of these devices. Typically, $R_e$ for a bipolar transistor is approximately $25/I_E$ where $I_E$ is the bias emitter current in milliamps. For example, with an $I_E$ of 1 mA, $R_e$ is approximately 25 ohms, and the input impedance $R_{IN}$ of inverting input 22 is approximately 12 ohms. For typical feedback resistor values of about 1000 ohms, the product $G\,R_{IN}$ becomes comparable to $R_2$ for gains of about 100 or 40 decibels. However, the bandwidth will begin to roll off well before G reaches 40 dB.

Figure 2:
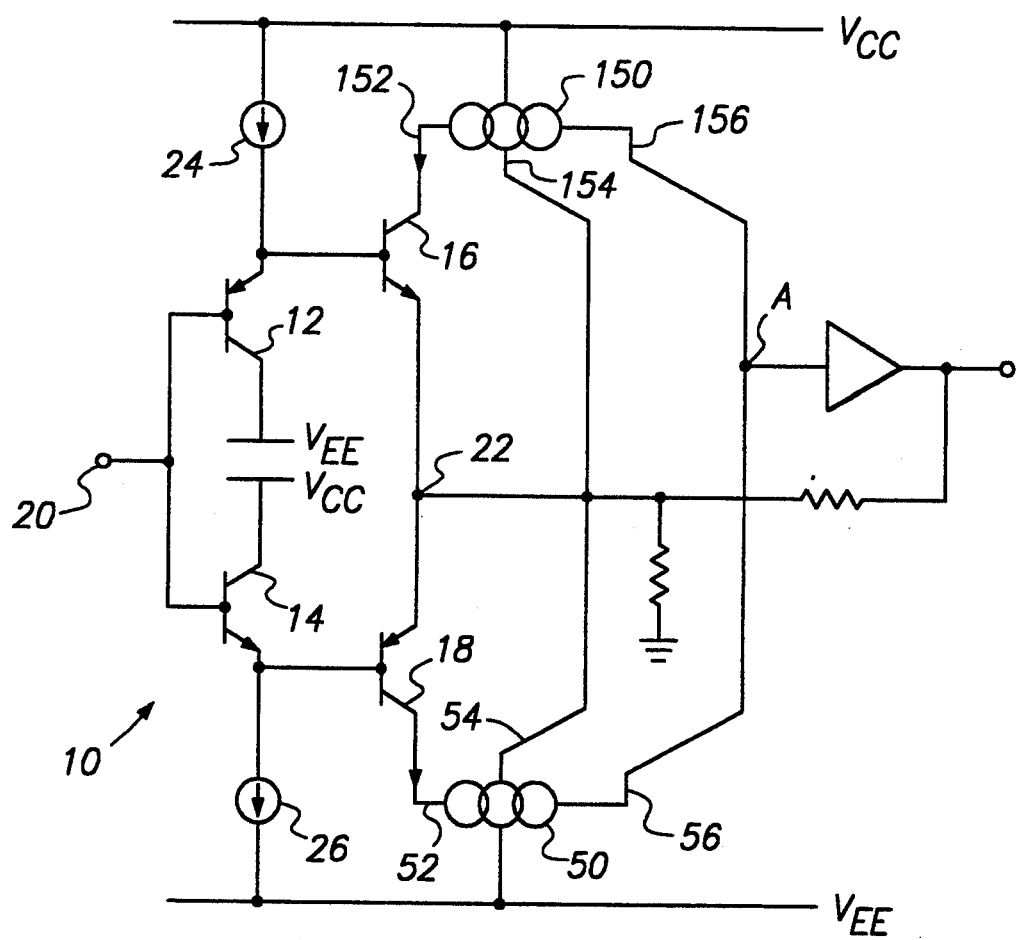
FIG. 2 is a schematic diagram of a current feedback operational amplifier including an input stage in accordance with the present invention.

Referring now to FIG. 2, there is shown a diagram of a current feedback operational amplifier 100 having an input stage in accordance with the present invention. Where the circuit elements are the same as in current feedback operational amplifier 40 of FIG. 1, the numbering has been retained. Thus, an input voltage buffer 10 comprises a first pair of complimentary transistors 12, 14 and a second pair of complimentary transistors 16, 18. The bases of transistors 12, 14 are connected together, forming a non-inverting input 20. The collectors of transistors 12, 14 are connected to supply voltages $V_{EE}$ and $V_{cc}$, respectively, and their emitters are connected to current sources 24, 26, respectively. Similarly, the emitters of transistors 16, 18 are connected together, forming an inverting input 22, their bases are connected to the emitters of transistors 12, 14, respectively, and their collectors are connected to current mirrors 50, 150, respectively.

Current mirrors 50, 150 are dual output current mirrors, each having a low impedance input current node 52 and 152, respectively, and a pair of high impedance current nodes 54, 56 and 154, 156, respectively. In current mirror 50, low impedance current node 52 is linked to inverting input 22 through transistor 18, while high impedance current node 54 is connected directly to inverting input 22, and high impedance current node 56 is connected to high gain node, A, of the operational amplifier. The low impedance current node 152 and high impedance current nodes 154 of dual output current mirror 150 are connected to inverting input 22 in a manner corresponding to that of current mirror 50. Similarly, high impedance node 156 is connected to high gain node A.

Figure 3:
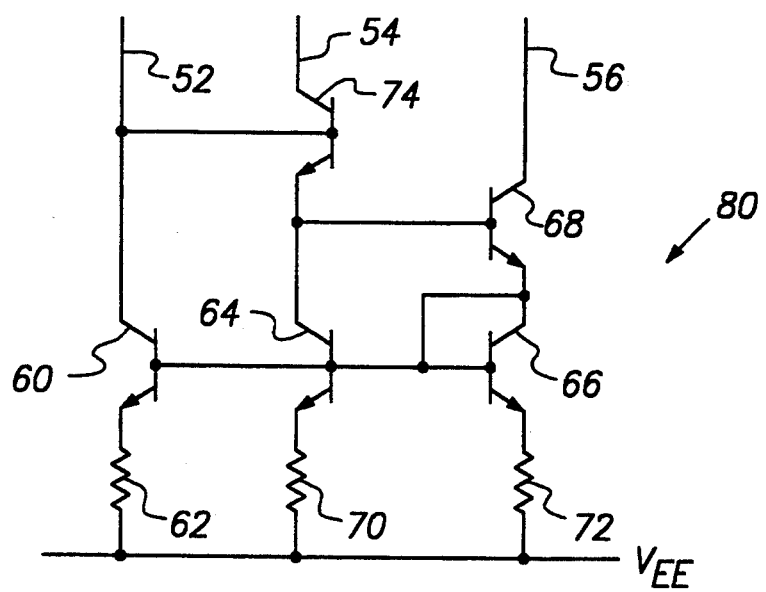
FIG. 3 is a schematic diagram of a dual output current mirror in accordance with the present invention.

Referring now to FIG. 3, there is shown a detailed schematic diagram of a dual output current mirror 50 in accordance with the present invention. A transistor 60 has its collector connected to the collector of transistor 18 of inverting input 22, its emitter connected to supply voltage $V_{EE}$ through a current scaling resistor 62, and its base connected to the bases of transistors 64, 66. The collector of transistor 60 is connected to the base of transistor 74 and forms low impedance input 52 of dual current-mirror 50. Input 52 is driven by the collector current of transistor 18. Transistors 64, 66, 68 are connected as a Wilson-type current mirror 80. The emitters of transistors 64, 66 are each connected to supply voltage $V_{EE}$ through current scaling resistors 70, 72, respectively, and their bases are connected to each other and to the base of transistor 60. The base and emitter of transistor 68 are connected to the collectors of transistors 64 and 66, respectively. The collector of transistor 68, which is the high impedance output node of Wilson-type current mirror 80, forms the high gain node of operational amplifier input stage 100 with the high impedance current node 156 of dual output current mirror 150. Transistor 74 has its base connected to the collector of transistor 60, its collector connected to inverting input 22, and its emitter connected to the collector of transistor 64. The collector of transistor 74 forms high impedance current node 54 and isolates transistor 64 from inverting input 22.

With dual output mirror 50 configured as above, currents in transistors 74, 68 are determined by the relative sizes of current scaling resistors 62, 70, and 72. For example, where the ratio of resistor 62 to resistor 70 is 1/K:1, currents KI and I are generated at the collectors of transistors 60, 74 which corresponds to current nodes 52, 54, respectively, of dual output current mirror 50. Thus, a signal at inverting input 22 which would generate current KI at the inverting input 22 of a conventional current feedback operational amplifier 40, generates a current (1+K)I at inverting input 22 of operational amplifier 100. Accordingly, the impedance of inverting input 22 with feedback from current mirror 50 is given by:

$$R'_{IN}=K\,R_{IN}/(1+K), \qquad \text{(Eq. IV)}$$

where $R_{IN}$ is the input impedance of the conventional operational amplifier 40 and $R'_{IN}$ is the input impedance of operational amplifier 100 with current feedback. By choosing resistors 70 so that $K<1$, the input impedance of inverting input 22 can be reduced significantly. Further, by choosing resistor 72 to have the same resistance as resistor 70, the current at high impedance node 56 will be amplified over the bias current in voltage buffer 10 by a factor 1/K. Thus, the bias current in voltage buffer 10 can be kept low without limiting the current and, consequently the slew rate, at high gain node A.

Figure 4:
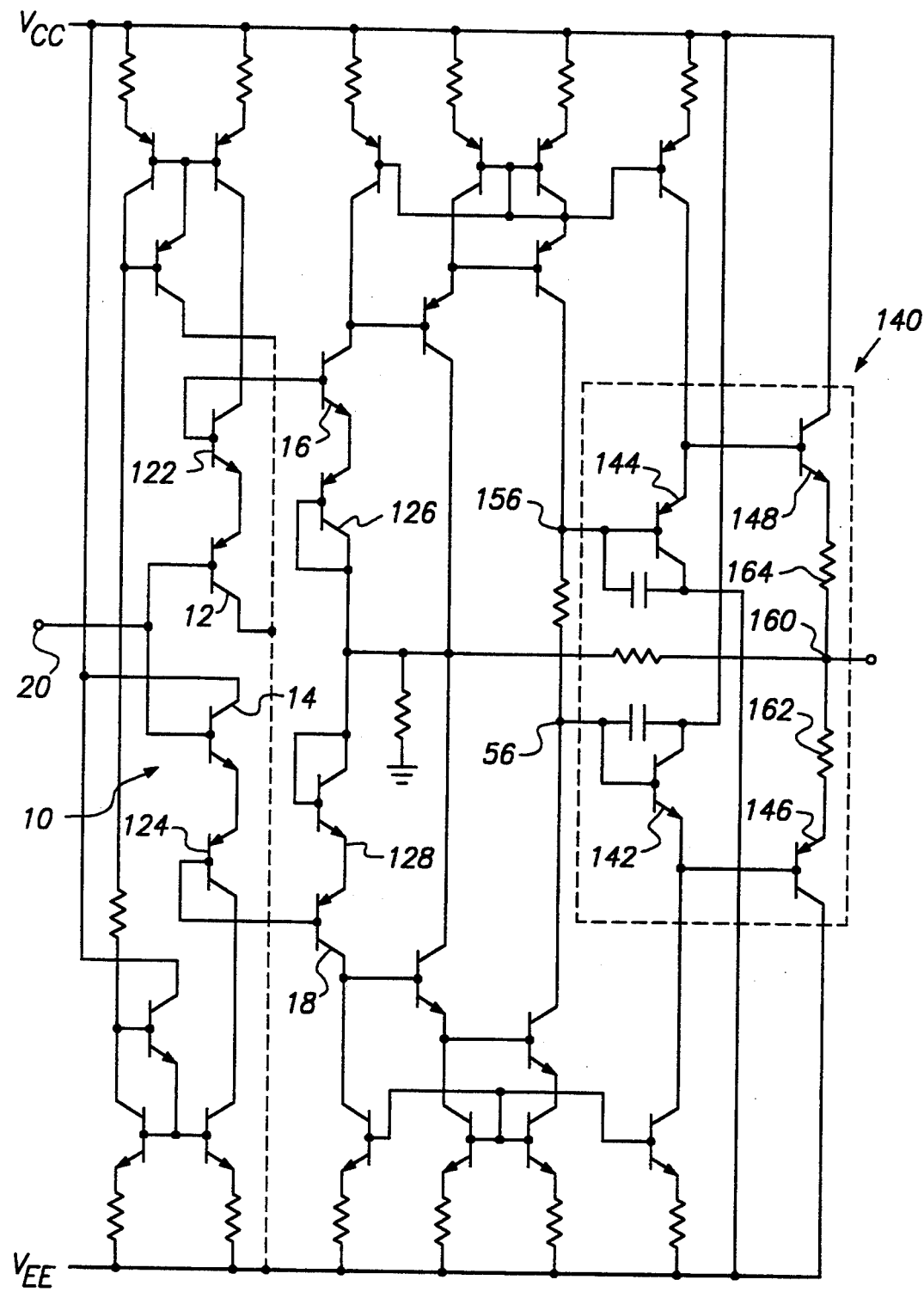
FIG. 4 is a detailed schematic diagram of a current feedback operational amplifier including an input stage in accordance with the present invention.

Referring now to FIG. 4, there is shown a detailed schematic diagram of a current feedback operational amplifier circuit in accordance with the present invention, including an output voltage buffer 140. Output buffer 140 comprises a pair of complimentary transistors 149, 144, the bases of which are connected to high impedance nodes 56, 156 of current mirrors 50, 150, respectively. A second pair of complimentary transistors 146, 148 have their emitters connected to an output 160 of the feedback amplifier through resistors 162, 164.

Voltage buffer 10 of the operational amplifier input stage 100 includes diode connected NPN and PNP transistors 122, 124, respectively, connected in series with voltage buffer transistors 12, 14, and diode connected PNP and NPN transistors 126, 128, respectively, connected in series with transistor pair 16, 18. Diode connected transistors 122, 126 and 124, 128 are included to offset any voltage differences between the PNP and NPN transistors 12, 16 and 14, 18, respectively, which would otherwise introduce differences between the voltages at non-inverting input 20 and inverting input 22.

Figure 5A:
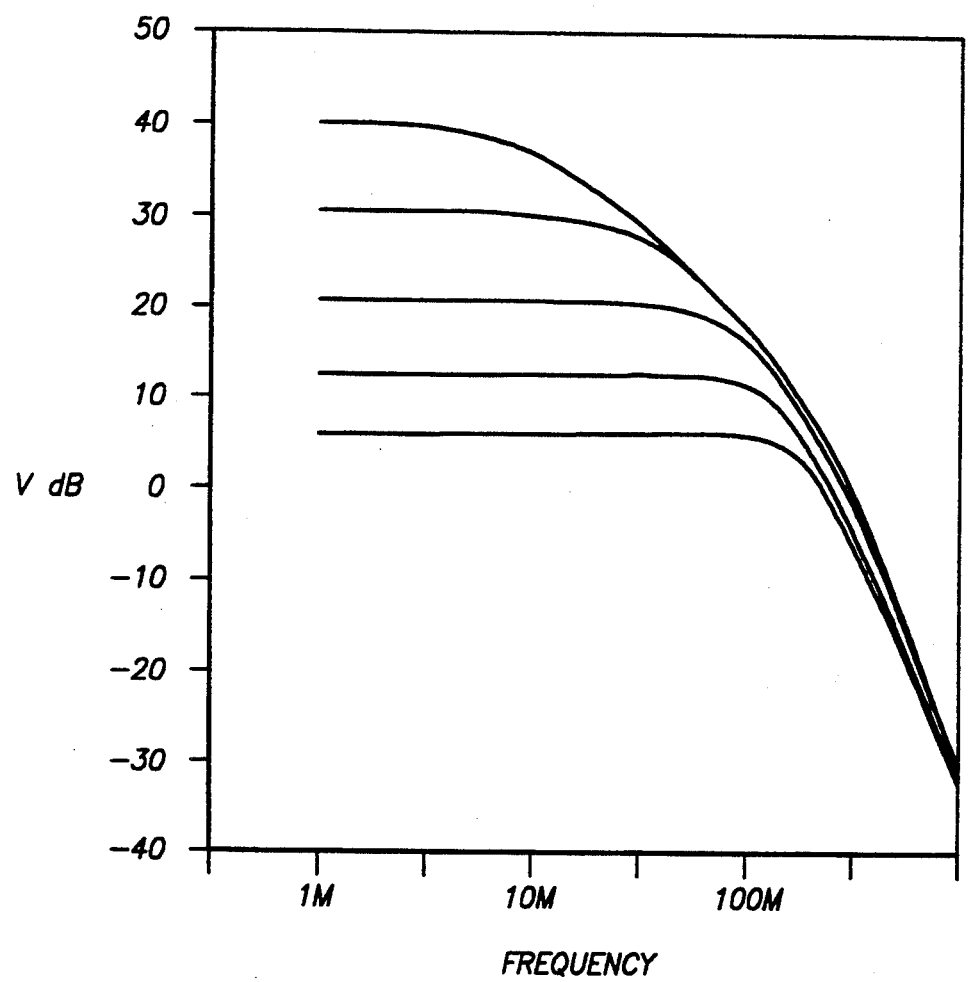
FIG. 5A is a simulation of the bandwidths at a series of different gains for a conventional current feedback operational amplifier.
Figure 5B:
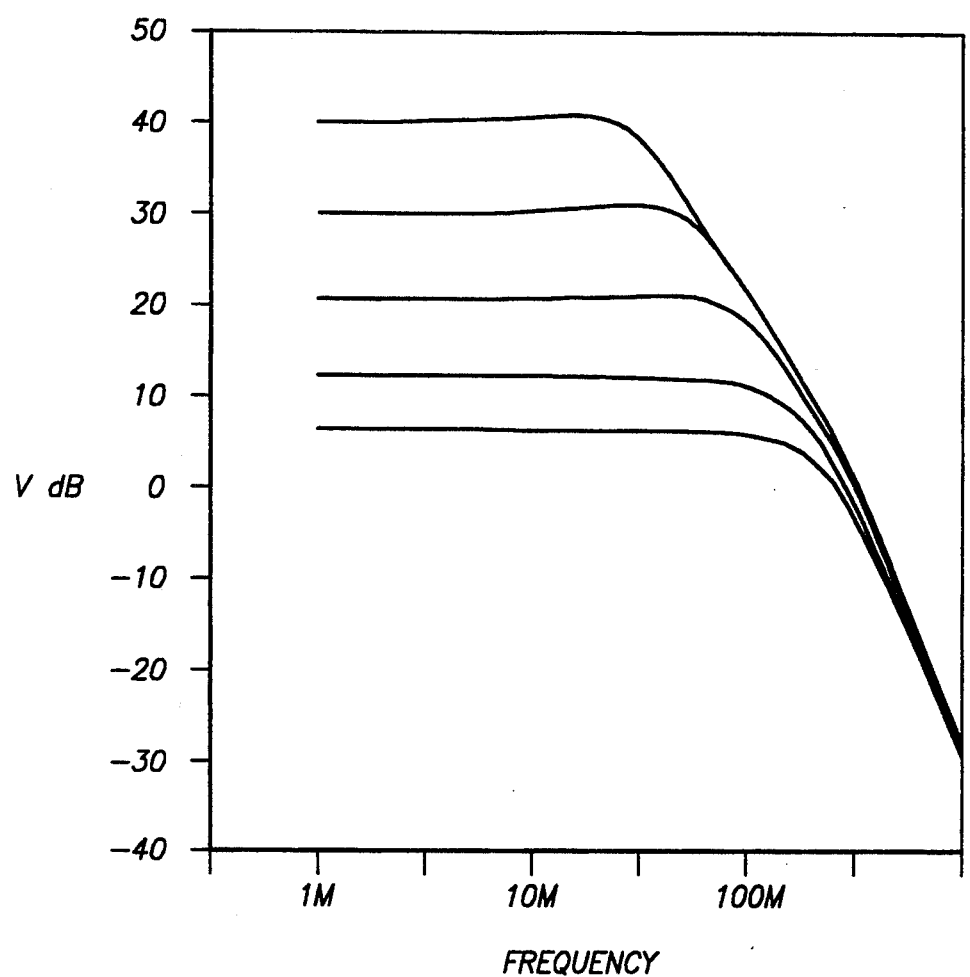
FIG. 5B is a simulation of the bandwidths at a series of different gains for a current feedback operational amplifier in accordance with the present invention.

Referring now to FIG. 5A, there are shown HSPICE simulations of the bandwidth of a conventional operational amplifier input stage at a series of different closed-loop gains. In FIG. 5B there are shown simulations of the bandwidth at a series of different gains for an operational amplifier having an input stage as shown in FIG. 4. Both simulations were generated using $C_c$ equal to 0.1 pF and $R_2$ equal to 1000 ohms. For gains of 6 dB, $B_W$ is approximately 200 MHz for both circuit designs. However, for gains of about 40 dB, $B_W$ for the conventional input stage is about a factor of twenty less than its value at 6 dB, while $B_W$ for a low $R_{IN}$ input stage of the present invention has fallen off by only a factor of five relative to its value at 6 dB. Thus, the low $R_{IN}$ of the present invention is effective to reduce the gain dependence of the operational amplifier circuit by increasing the gains necessary to make the factor G $R_{IN}$ comparable to the feedback resistance, $R_2$. The gain dependence of the transfer function is reduced and the DC closed-loop gain accuracy is improved by the same mechanism.

Figure 6:
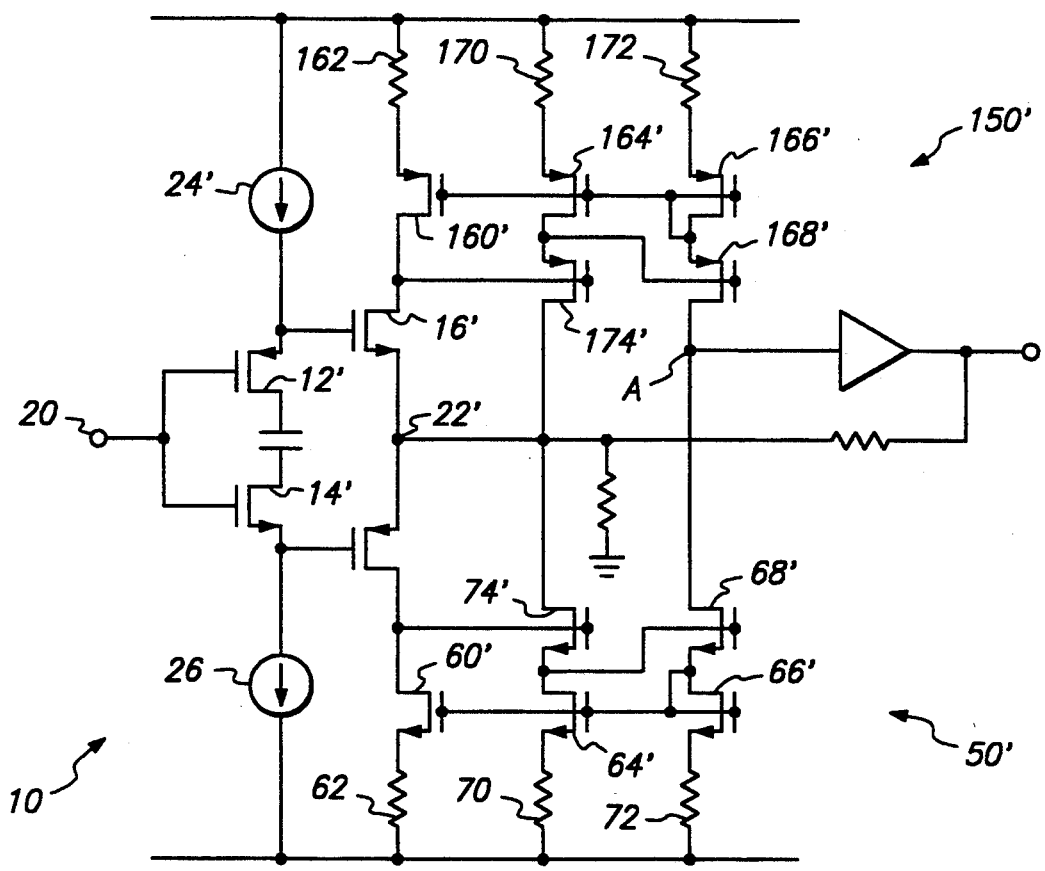
FIG. 6 is a schematic diagram of current feedback operational amplifier including an input stage in accordance with the present invention, based on field effect transistors (FETs).

Referring now to FIG. 6 there is shown a low input resistance current feedback operational amplifier in accordance with the present invention in which bipolar transistors are replaced by FET transistors. FET transistors are indicated by primed reference numbers corresponding to the reference number of the comparably connected bipolar transistor.

What is claimed is:

1. A low input resistance current feedback operational amplifier input stage comprising:
   a voltage buffer having inverting and non-inverting inputs, the non-inverting input being formed by the bases of a first pair of transistors having complimentary conductivity properties, and the inverting input being formed by the emitters of a second pair of transistors having complimentary conductivity properties, for replicating a voltage applied to the non-inverting input of the voltage buffer at the inverting input;
   a pair of current sources each of which is coupled to the emitter of one of the first pair of transistors, for providing bias current to the non-inverting input of the voltage buffer;
   a pair of dual output current mirrors, each dual output current mirror comprising:
      a first transistor having a base, collector, and emitter, the collector being connected to the collector of one of the second pair of transistors of the voltage buffer, and the emitter being connected to a supply voltage through a first current scaling resistor, for sensing collector current at the inverting input of the voltage buffer;
      second, third, and fourth transistors connected in a Wilson-type current mirror configuration, each transistor having a base, collector, and emitter, the second transistor having its emitter connected to a supply voltage through a second current-scaling resistor, its base connected to the bases of the first and third transistors, and its collector connected to the inverting input of the amplifier through a current-buffer transistor, the third transistor having its emitter connected to a supply voltage through a third current-scaling resistor and its base and collector connected to the emitter of the fourth transistor, and the fourth transistor having its base connected to the collector of the second transistor and its collector forming a high gain node of the amplifier input stage, the first transistor being effective to detect current at the inverting input and to generate corresponding currents in the second and third transistors, the currents being determined according to the relative sizes of the first, second, and third current-scaling resistors.

2. The low input resistance current feedback operational amplifier of claim 1, wherein the first, second, and third current-scaling resistors have resistances in the ratio of K:1:1, respectively, where K is between 1 and 0.1.

3. The low input resistance current feedback operational amplifier of claim 2, wherein K is between 0.15 and 0.25.

4. A low input resistance current feedback operational amplifier comprising:
   a push-pull input voltage buffer having inverting and non-inverting signal inputs and a pair of current coupling inputs for each signal input, the input voltage buffer being effective to replicate a signal applied to the non-inverting input at the inverting input when bias current is applied to the current coupling inputs of the non-inverting input;
   a pair of current sources each having an output coupled to one of the current inputs of the non-inverting signal input, for providing bias current to the non-inverting signal input of the voltage buffer;
   a pair of dual output current mirrors, each current mirror comprising:
      a current source transistor having a base, collector, and emitter, the emitter being connected to a supply voltage through a first current-scaling resistor, and the collector being connected to one of the current coupling inputs of the inverting signal input, the current source transistor being effective to detect current at the inverting signal input of the voltage buffer and provide a corresponding voltage at its base; and
      a Wilson-type current mirror having first and second high impedance current nodes, a voltage coupling node, and second and third current-scaling resistors for controlling the current flowing in the high impedance current nodes, the first high impedance current node being connected to the inverting signal input of the amplifier, the second high impedance current node forming a high gain node for the amplifier, and the voltage coupling node being connected to the base of the current source transistor, the dual current mirror being effective to generate feedback current at the inverting input and an output current at the high gain node of the amplifier, in response to the current detected at the inverting input by the current source transistor, the magnitude of the feedback and output currents being scaled according to the resistances of the first, second, and third current scaling resistors;
   an output buffer having an input connected to the high gain node of the amplifier and an output forming the output of the amplifier, for coupling a signal at the high gain node of the amplifier to the amplifier output; and
   a feedback circuit comprising a feedback resistor connected between the amplifier output and the inverting input of the voltage buffer, and a gain-setting resistor connected between the inverting input of the voltage buffer and ground, for coupling a sample of the output voltage to the inverting input.

5. The low input resistance current feedback operational amplifier of claim 4, wherein the first, second, and third current-scaling resistors have resistances in the ratio of K:1:1, respectively, where K is between 1 and 0.1.

6. A low input resistance current feedback operational amplifier input stage comprising:
- a first pair of FETs of complimentary conductivity types, each having a source, drain and gate, and a second pair of FETs of complimentary conductivity types, each having a source, drain and gate, the first and second pairs of FETs forming a voltage buffer having a non-inverting input formed by the gates of the first pair of FETs, and an inverting input formed by a common connection of the sources of the second pair of FETs for replicating a voltage applied to the noninverting input of the voltage buffer at the inverting input;
- a pair of current sources, each of which is coupled to the drain of one of the first pair of FETs, for providing bias current to the non-inverting input of the voltage buffer;
- a supply voltage; and
- a pair of dual output current mirrors, each dual output current mirror comprising:
  - first, second, and third current-scaling resistors;
  - a first FET having a gate, drain, and source, the drain being connected to the drain of one of the second pair of FETs of the voltage buffer, and the source being connected to the supply voltage through the first current-scaling resistor, for sensing drain current at the inverting input of the voltage buffer;
  - second, third, and fourth FETs connected in a Wilson-type current mirror configuration, each FET having a gate, drain, and source, the second FET having its source connected to the supply voltage through the second current-scaling resistor, its gate connected to the gates of the first and third FETs, and its collector connected to the inverting input of the amplifier through a current buffer FET, the third FET having its source connected to the supply voltage through the third current-scaling resistor and its gate and drain connected to the source of the fourth FET, and the fourth FET having its gate connected to the drain of the second FET and its drain forming a high gain node of the amplifier input stage, the first FET being effective to detect current at the inverting input and to generate corresponding currents in the second and third FETs, the currents being determined according to the relative sized of the first, second, and third current scaling resistors.

* * * * *